United States Patent
Li

(10) Patent No.: US 10,424,668 B2
(45) Date of Patent: Sep. 24, 2019

(54) LOW TEMPERATURE POLYSILICON THIN FILM TRANSISTOR AND FABRICATING METHOD THEREOF AND ARRAY SUBSTRATE

(71) Applicant: Wuhan China Star Optoelectronics Semiconductor Display Technology Co., Ltd., Wuhan, Hubei (CN)

(72) Inventor: Songshan Li, Guangdong (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 1 day.

(21) Appl. No.: 15/910,264

(22) Filed: Mar. 2, 2018

(65) Prior Publication Data
US 2019/0088787 A1 Mar. 21, 2019

Related U.S. Application Data

(63) Continuation of application No. PCT/CN2018/071299, filed on Jan. 4, 2018.

(30) Foreign Application Priority Data

Sep. 20, 2017 (CN) .......................... 2017 1 0850475

(51) Int. Cl.
*H01L 29/786* (2006.01)
*H01L 29/167* (2006.01)
(Continued)

(52) U.S. Cl.
CPC .. *H01L 29/78618* (2013.01); *H01L 21/02175* (2013.01); *H01L 21/02266* (2013.01);
(Continued)

(58) Field of Classification Search
CPC .......... H01L 27/1214; H01L 29/66757; H01L 27/1288; H01L 27/127; H01L 29/78621;
(Continued)

(56) References Cited

U.S. PATENT DOCUMENTS

2007/0273292 A1* 11/2007 Choi ................... H01L 27/1446
315/158
2015/0364610 A1* 12/2015 Tsubuku ........... H01L 29/78696
257/43

FOREIGN PATENT DOCUMENTS

| CN | 1453837 A | * 11/2003 |
| CN | 101071816 A | 11/2007 |
| CN | 106024639 A | 10/2016 |

* cited by examiner

Primary Examiner — Ermias T Woldegeorgis
(74) *Attorney, Agent, or Firm* — Hauptman Ham, LLP

(57) ABSTRACT

A LTPS TFT comprises a substrate, and a buffer layer, a low temperature polysilicon layer, a source contact area, a drain contact area, a gate insulating layer, a gate layer, a dielectric layer, a source and a drain disposed on the substrate successively. The source contact area and the drain contact area are doped with metal ions individually. The source and the drain are connecting with the source and drain contact areas separately through the dielectric layer. The metal ions include at least one of $Cu^{2+}$, $Al^{3+}$, $Mg^{2+}$, $Zn^{2+}$ and $Ni^{2+}$. A method of fabricating the LTPS TFT is also provided. An annealing is performed for driving individually metal ions of the insulation metal oxide layer into the source contact area and the drain contact area. Thus, the step of implanting p-type ions can be omitted, the procedure can be significantly simplified, and the manufacturing cost can be reduced.

7 Claims, 3 Drawing Sheets

(51) Int. Cl.
  *H01L 21/225* (2006.01)
  *H01L 21/02* (2006.01)
  *H01L 29/66* (2006.01)
  *H01L 21/38* (2006.01)
  *H01L 21/22* (2006.01)
  *H01L 21/3215* (2006.01)

(52) U.S. Cl.
  CPC .......... *H01L 21/22* (2013.01); *H01L 21/2251* (2013.01); *H01L 21/2255* (2013.01); *H01L 21/38* (2013.01); *H01L 29/167* (2013.01); *H01L 29/66757* (2013.01); *H01L 29/78675* (2013.01); *H01L 21/02178* (2013.01); *H01L 21/32155* (2013.01)

(58) Field of Classification Search
  CPC ......... H01L 29/78609; H01L 29/78675; H01L 21/22; H01L 21/2251; H01L 21/38
  See application file for complete search history.

LOW TEMPERATURE POLYSILICON THIN FILM TRANSISTOR AND FABRICATING METHOD THEREOF AND ARRAY SUBSTRATE

RELATED APPLICATIONS

The present application is a National Phase of International Application Number PCT/CN2018/071299, filed Jan. 4, 2018, and claims the priority of China Application No. 201710850475.3, filed Sep. 20, 2017.

FIELD OF THE DISCLOSURE

The disclosure relates to a display technical field, and more particularly to a low temperature polysilicon thin film transistor and fabricating method thereof, and an array substrate.

BACKGROUND

Currently, in the conventional fabricating process of the low temperature polysilicon thin film transistor (LTPS TFT), when the low temperature polysilicon layer is defined with source and drain contact areas, it is required to use a mask for defining the areas for ions implant, and then an ion implantation equipment is applied to implant a certain amount of phosphorus ions for forming the source and drain contact areas. However, the cost of the ion implantation equipment is very high, and the ion implant process is very complicated.

SUMMARY

A method of forming a low temperature polysilicon thin film transistor (LTPS TFT) is provided in the embodiment of the present invention for simplifying the procedures of the method of forming the LTPS TFT.

In a first aspect, the present invention provides a LTPS TFT, comprising: a substrate; and a buffer layer, a low temperature polysilicon layer, a source contact area, a drain contact area, a gate insulating layer, a gate layer, a dielectric layer, a source and a drain disposed on the substrate successively. The source contact area and the drain contact area are disposed in a same layer with the low temperature polysilicon layer and at two opposite sides of the low temperature polysilicon layer separately. The source contact area and the drain contact area are doped with metal ions individually.

The source is connecting with the source contact area through the dielectric layer to form an ohmic contact, and the drain is connecting with the drain contact area through the dielectric layer to form the ohmic contact. The metal ions include at least one of $Cu^{2+}$, $Al^{3+}$, $Mg^{2+}$, $Zn^{2+}$ and $Ni^{2+}$.

In an embodiment, the LTPS TFT further comprising an insulation metal oxide layer disposed between the low temperature polysilicon layer and the dielectric layer. The source is connecting with the source contact area through the dielectric layer and the insulation metal oxide layer successively to form the ohmic contact, and the drain is connecting with the drain contact area through the dielectric layer and the insulation metal oxide layer successively to form the ohmic contact.

In a second aspect, the present invention provides a method of forming the LTPS TFT. The method of forming the LIPS TFT comprises: providing a substrate; forming a buffer layer, a low temperature polysilicon layer, a source contact area to be formed, a drain contact area to be formed, a gate insulating layer and a gate layer on the substrate successively; wherein the source contact area to be formed and the drain contact area to be formed are disposed in a same layer with the low temperature polysilicon layer and at two opposite sides of the low temperature polysilicon layer separately; depositing an insulation metal oxide layer on the low temperature polysilicon layer to cover the source contact area to be formed and the drain contact area to be formed, and driving individually metal ions of the insulation metal oxide layer into the source contact area to be formed and the drain contact area to be formed to form the source contact area and the drain contact area after an annealing procedure; wherein the metal ions include at least one of $Cu^{2+}$, $Al^{3+}$, $Mg^{2+}$, $Zn^{2+}$ and $Ni^{2+}$; and forming a source contacting the source contact area and a drain contacting the drain contact area on the low temperature polysilicon layer.

In an embodiment, a temperature of the annealing procedure is about 300-450° C. and a period of the annealing procedure is 30-50 min.

In an embodiment, a material of the insulation metal oxide layer includes at least one of CuO, $Al_2O_3$, MgO, ZnO and NiO.

In an embodiment, a thickness of the insulation metal oxide layer is about 10-20 nm.

In an embodiment, the method of forming the LTPS TFT further comprises the steps of depositing a dielectric layer on the gate layer to cover the gate layer and the insulation metal oxide layer before forming the source and the drain; performing a dry etching to form a first contact hole and a second contact hole passing through the dielectric layer and the insulation metal oxide layer, for exposing the source contact area and the drain contact area separately; and forming the source connecting with the source contact area through the first contact hole and the drain connecting with the drain contact area through the second contact hole on the dielectric layer.

In an embodiment, the method of forming the LTPS TFT further comprising: removing the annealed insulation metal oxide layer by a dry etching before forming the source and the drain; depositing a dielectric layer on the gate layer to cover the gate layer, the low temperature polysilicon layer and the buffer layer; performing a dry etching to form a third contact hole and a fourth contact hole passing through the dielectric layer, for exposing the source contact area and the drain contact area separately; and forming the source connecting with the source contact area through the third contact hole and the drain connecting with the drain contact area through the fourth contact hole on the dielectric layer.

In an embodiment, a physical vapor deposition (PVD) process is applied to form the insulation metal oxide layer, and the PVD process includes applying an inert gas at a flow of 2-6 sccm, and a pressure of the inert gas is 0.2-1.0 Pa, a deposition power of the PVD process is 10-15 kw.

In a third aspect, the present invention provides an array substrate comprising the above LTPS TFT or the LTPS TFT fabricated by the above method.

The present invention has the following advantages:

In the method of fabricating the LTPS TFT provided by the present invention, an annealing is performed after depositing the insulation metal oxide layer, for driving individually metal ions of the insulation metal oxide layer into the source contact area to be formed and the drain contact area to be formed, to form the source contact area and the drain contact area, and thereby to form the ohmic contact. Thus, the step of implanting p-type ions can be omitted, the procedure can be significantly simplified, and the manufacturing cost can be reduced.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution and should not be interpreted as merely limited to the embodiments described herein.

Figure 1:
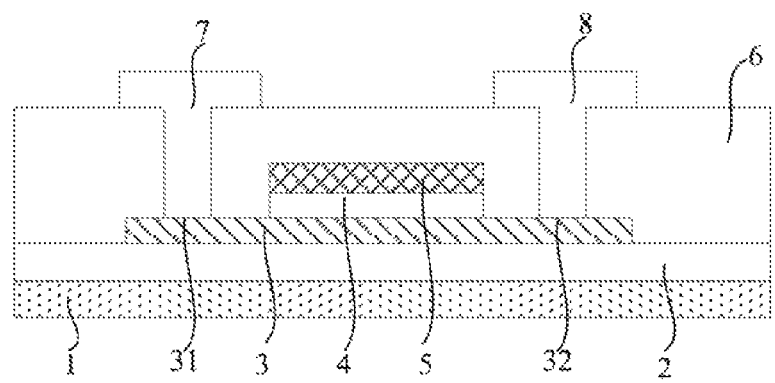
FIG. 1 is a cross-sectional view of the low temperature polysilicon thin film transistor (LTPS TFT) provided by an embodiment of the present invention.

Referring to FIG. 1, a cross-sectional view of the low temperature polysilicon thin film transistor (LTPS TFT) provided by the present invention is illustrated. In a first aspect, the LTPS TFT provided by an embodiment of the present invention provides comprises a substrate 1; and a buffer layer 2, a low temperature polysilicon layer 3, a source contact area 31, a drain contact area 32, a gate insulating layer 4, a gate layer 5, a dielectric layer 6, a source 7 and a drain 8 disposed on the substrate successively. The source contact area 31 and the drain contact area 32 are disposed in a same layer with the low temperature polysilicon layer 3 and at two opposite sides of the low temperature polysilicon layer 3 separately. The source contact area 31 and the drain contact area 32 are doped with metal ions individually.

The source 7 is connecting with the source contact area 31 through the dielectric layer 6 to form an ohmic contact, and the drain 8 is connecting with the drain contact area 32 through the dielectric layer 6 to form the ohmic contact. The metal ions include at least one of $Cu^{2+}$, $Al^{3+}$, $Mg^{2+}$, $Zn^{2+}$ and $Ni^{2+}$.

In this embodiment, the buffer layer 2, the low temperature polysilicon layer 3, the gate insulating layer 4 and the gate layer 5 are formed to be convex structures on the substrate. In specific, the buffer layer 2 is covering the whole substrate 1, the low temperature polysilicon layer 3 is covering a part of the buffer layer 2, the gate insulating layer 4 is covering a part of the low temperature polysilicon layer 3, the gate layer 5 is covering the whole gate insulating layer 4. Optionally, the low temperature polysilicon layer includes a first area, and the gate insulating layer and the gate are stacked on the first area successively. The source contact area and the drain contact area are disposed at two sides of the first area.

It is understandable, an insulation metal oxide layer may be disposed between the low temperature polysilicon layer and the dielectric layer. The source is connecting with the source contact area through the dielectric layer and the insulation metal oxide layer successively to form the ohmic contact, and the drain is connecting with the drain contact area through the dielectric layer and the insulation metal oxide layer successively to form the ohmic contact. Optionally, the insulation metal oxide layer is disposed on the gate layer to cover the gate layer and the low temperature polysilicon layer, and the dielectric layer is covering the insulation metal oxide layer.

Figure 2:
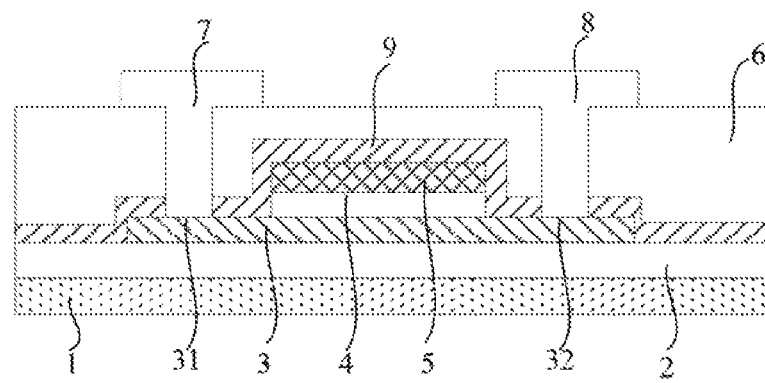
FIG. 2 is a cross-sectional view of the LTPS TFT with the insulation metal oxide layer provided by an embodiment of the present invention.

Referring to FIG. 2, a cross-sectional view of the LTPS TFT with the insulation metal oxide layer is illustrated. The insulation metal oxide layer 9 is disposed on the gate layer 5 to cover the gate layer 5, the low temperature polysilicon layer 3 and the buffer layer 2. The source 7 is connecting with the source contact area 31 through the dielectric layer 6 and the insulation metal oxide layer 9 successively to form the ohmic contact, and the drain 8 is connecting with the drain contact area 32 through the dielectric layer 6 and the insulation metal oxide layer 9 successively to form the ohmic contact.

In this embodiment, the source contact area 31 and the drain contact area 32 may be doped with the same ions, and the doping amounts thereof may be the same.

In this embodiment, the material of the insulation metal oxide layer 9 includes at least one of CuO, $Al_2O_3$, MgO, ZnO and NiO. The thickness of the insulation metal oxide layer 9 is about 10-20 nm.

In this embodiment, the LTPS TFT is a n-type LTPS TFT.

In this embodiment, the source contact area 31 and the drain contact area 32 are doped with the metal ions, for promoting the concentration of surface carriers of the low temperature polysilicon layer, to form the ohmic contacts between the source 7 and the source contact area 31, and between the drain 8 and the drain contact area 32.

Figure 3:
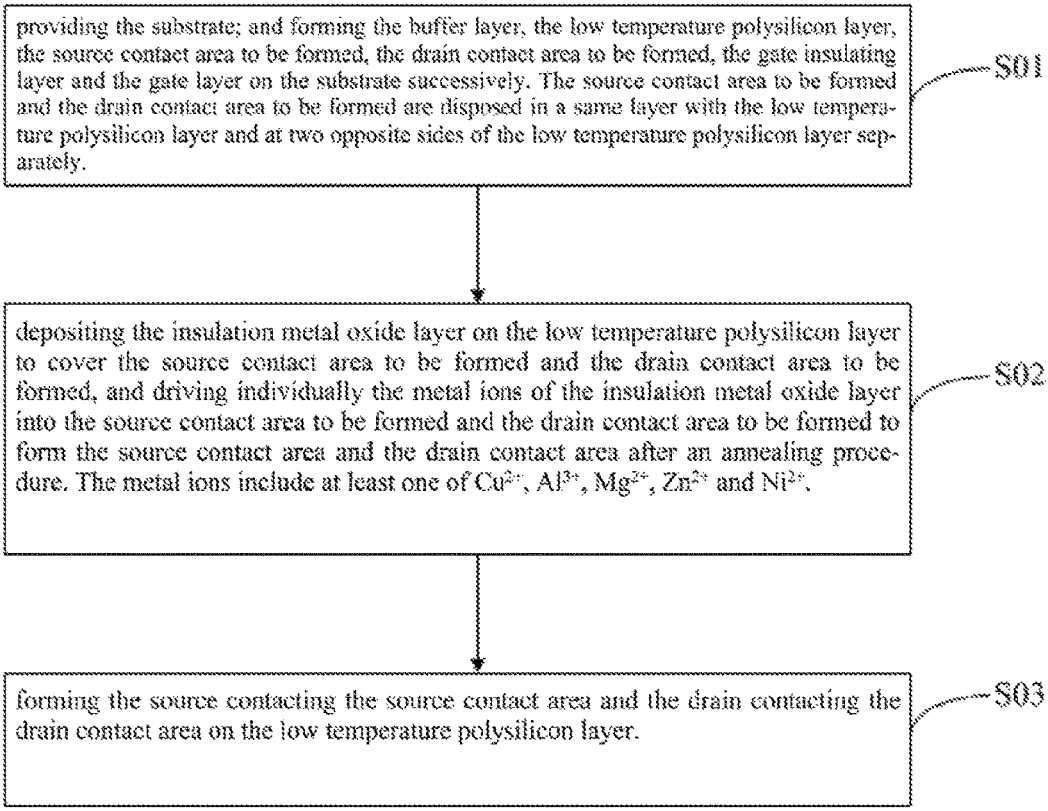
FIG. 3 is a flow chart illustrating the steps of the method of fabricating the LTPS TFT.
Figure 4:
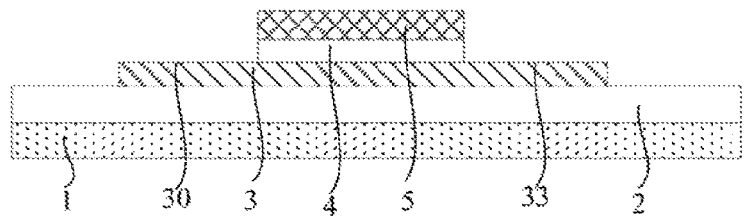
FIG. 4 is a scheme view illustrating the substrate formed with the buffer layer, the low temperature polysilicon layer, the gate insulating layer and the gate layer in step S01.
Figure 5:
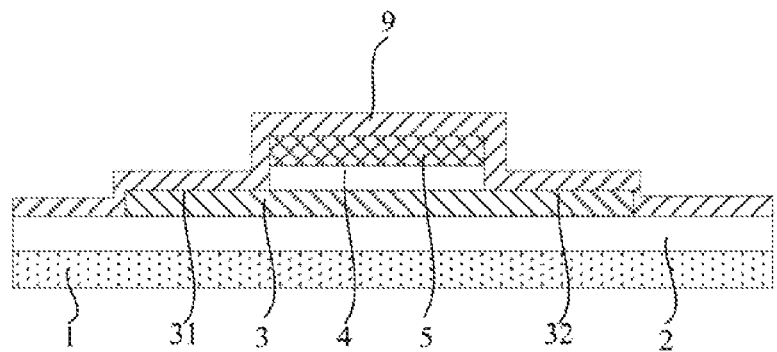
FIG. 5 is a scheme view illustrating the substrate formed with the insulation metal oxide layer in step S02.

Referring to FIG. 3, FIG. 4 and FIG. 5. FIG. 3 is a flow chart for illustrating the steps of the method of fabricating the LTPS TFT. FIG. 4 is a scheme view illustrating the substrate formed with the buffer layer, the low temperature polysilicon layer, the gate insulating layer and the gate layer in step S01. FIG. 5 is a scheme view illustrating the substrate formed with the insulation metal oxide layer in step S02. In the second aspect, a method of forming the LTPS TFT provided by the embodiment of the present invention comprises the following steps.

Step S01 is providing the substrate 1; and forming the buffer layer 2, the low temperature polysilicon layer 3, the source contact area to be formed 30, the drain contact area to be formed 33, the gate insulating layer 4 and the gate layer 5 on the substrate 1 successively. The source contact area to be formed 30 and the drain contact area to be formed 33 are disposed in a same layer with the low temperature polysilicon layer 3 and at two opposite sides of the low temperature polysilicon layer 3 separately.

In this embodiment, the substrate 1 is first performed pre-cleaning in case the cleanliness of the substrate 1 is not satisfied to the demand. The material of the substrate may be, but not limited to, a glass substrate or a flexible substrate.

In this embodiment, the filming process, such as plasma enhanced chemical vapor deposition (PECVD), is applied to form one layer of the buffer layer 2 on the substrate 1. Optionally, the material of the buffer layer 2 includes at least one of silicon nitride and silicon oxide. Further optionally, the buffer layer 2 could be one layer of silicon oxide (SiOx) or silicon nitride (SiNx), or a stack of silicon oxide (SiOx) and silicon nitride (SiNx). Preferably, the material of the buffer layer 2 is silicon oxide (SiOx).

In this embodiment, the filming process, such as PECVD, is applied to form an amorphous silicon layer on the buffer layer 2. The amorphous silicon layer is covering a part of the buffer layer. Then, an annealing procedure is performed to the amorphous silicon layer, to transform the amorphous silicon layer into the low temperature polysilicon layer 3. In specific, an excimer laser annealing (ELA) is applied to transform the amorphous silicon layer into a polysilicon layer. Then, the polysilicon layer is defined with patterns to form the low temperature polysilicon layer 3. In specific, a lithography process is applied for patterning. The low temperature polysilicon layer 3 includes the source contact area to be formed 30 and the drain contact area to be formed 33.

In this embodiment, a filming process is applied to form the gate insulating layer 4 on the low temperature polysilicon layer 3. The gate insulating layer 4 is covering a part of the low temperature polysilicon layer 3. Optionally, the material of the gate insulating layer 4 includes at least one of silicon nitride and silicon oxide. Further optionally, the gate insulating layer 4 could be one layer of silicon oxide (SiOx) or silicon nitride (SiNx), or a stack of silicon oxide (SiOx) and silicon nitride (SiNx). Preferably, the material of the gate insulating layer 4 is silicon oxide (SiOx).

In this embodiment, a filming process, such as physical vapor deposition (PVD), is applied to form the gate layer 5 on the gate insulating layer 4. The gate layer 5 is covering the whole gate insulating layer 4. Optionally, the material of the gate layer 5 may be a metal or an alloy, and the metal may be formed of Mo, Al, Cu and W, and the alloy may be formed of at least two of Mo, Al, Cu and W. Preferably, the material of the gate layer 5 is Mo. Optionally, the low temperature polysilicon layer includes a first area, and the gate insulating layer and the gate are stacked successively on the first area. The source contact area to be formed and the drain contact area to be formed are disposed at two sides of the first area.

Referring to FIG. 4, by performing the step S01, the buffer layer 2, the low temperature polysilicon layer 3, the gate insulating layer 4 and the gate layer 5 are formed successively on the substrate 1.

Step S02 is depositing the insulation metal oxide layer 9 on the low temperature polysilicon layer 3 to cover the source contact area to be formed 30 and the drain contact area to be formed 33, and driving individually the metal ions of the insulation metal oxide layer 9 into the source contact area to be formed 30 and the drain contact area to be formed 33 to form the source contact area 30 and the drain contact area 33 after an annealing procedure. The metal ions include at least one of $Cu^{2+}$, $Al^{3+}$, $Mg^{2+}$, $Zn^{2+}$ and $Ni^{2+}$.

In this embodiment, by forming the insulation metal oxide layer 9 and performing the annealing procedure, the metal ions of the insulation metal oxide layer 9 are driven to diffuse into the source contact area to be formed 30 and the drain contact area to be formed 33, thereby to form the source contact area 30 and the drain contact area 31 with the metal ions doped therein, for achieving the ions doping into the polysilicon. There is no need to perform the traditional ions implant. The method provided by the embodiment of the present invention is simpler and has the less manufacturing cost.

It is understandable, in the embodiment of the present invention, the insulation metal oxide layer may be only formed on the source contact area to be formed and the drain contact area to be formed to cover the source contact area to be formed and the drain contact area to be formed. The insulation metal oxide layer may also be formed on the low temperature polysilicon layer in the area not covered by the gate insulating layer. Optionally, the insulation metal oxide layer may be formed on the gate layer to cover the gate layer and the low temperature polysilicon layer. Optionally, the insulation metal oxide layer may be formed on the gate layer to cover the gate layer, the low temperature polysilicon layer and the buffer layer. Referring to FIG. 5, a whole layer of the insulation metal oxide layer 9 is formed on the gate layer 5, the low temperature polysilicon layer 3 and the buffer layer 2, Namely, a whole layer of the insulation metal oxide layer 9 is formed on the uncovered area of the buffer layer 2, the uncovered area of the low temperature polysilicon layer 3 and the gate layer 5.

In this embodiment, the PVD process is applied to form the insulation metal oxide layer 9. The specific parameters of the PVD process include applying an inert gas at a flow of 2-6 sccm, a pressure of the inert gas is 0.2-1.0 Pa, and a deposition power of the PVD process is 10-15 kw. Optionally, the inert gas is the argon gas, and the flow of the argon gas is 4 sccm, the pressure of the argon gas is 0.5 Pa, the deposition power of the PVD process is 15 kw.

In this embodiment, the temperature of the annealing procedure is about 300-450° C. and a period of the annealing procedure is 30-50 min. In specific, the temperature of the annealing procedure may be 300° C., 320° C., 350° C., 370° C., 400° C., 420° C. or 450° C., and the period of the annealing procedure may be 30 min, 35 min, 40 min, 45 min or 50 min.

In this embodiment, the material of the insulation metal oxide layer 9 includes at least one of CuO, $Al_2O_3$, MgO, ZnO and NiO. The thickness of the insulation metal oxide layer 9 is about 10-20 nm. Optionally, the thickness of the insulation metal oxide layer may be 10 nm, 12 nm, 15 nm, 16 nm, 18 nm or 20 nm.

Step S03 is forming the source 7 contacting the source contact area 31 and the drain 8 contacting the drain contact area 32 on the low temperature polysilicon layer 3.

In specific, depositing a dielectric layer 6 on the gate layer 5 to cover the gate layer 5 and the insulation metal oxide layer 9 before forming the source 7 and the drain 8; then performing a dry etching to form a first contact hole and a second contact hole passing through the dielectric layer 6 and the insulation metal oxide layer 9, for exposing the source contact area 31 and the drain contact area 32 separately; and forming the source 7 connecting with the source contact area 31 through the first contact hole and the drain 8 connecting with the drain contact area 32 through the second contact hole on the dielectric layer 6.

Optionally, the insulation metal oxide layer is formed on the low temperature polysilicon layer to cover only the source contact area to be formed and the drain contact area to be formed. Then, the dielectric layer is formed on the gate layer to cover the gate layer, the insulation metal oxide layer and the buffer layer. Optionally, the insulation metal oxide layer may be formed on the gate layer to cover the gate layer, the low temperature polysilicon layer and the buffer layer. Then, a whole layer of the dielectric layer is formed on the insulation metal oxide layer. The structure of the fabricated LTPS TFT is as shown in FIG. 2.

It should be noted, after performing the step S02, the insulation metal oxide layer may be reserved as aforementioned for later use, or alternatively, the insulation metal oxide layer may be removed by applying a dry etching. In specific, the annealed insulation metal oxide layer is removed by a dry etching before forming the source and the drain. Then a dielectric layer is deposited on the gate layer to cover the gate layer, the low temperature polysilicon layer and the buffer layer. A dry etching is performed to form a third contact hole and a fourth contact hole passing through the dielectric layer for exposing the source contact area and the drain contact area separately, and the source connecting with the source contact area through the third contact hole and the drain connecting with the drain contact area through the fourth contact hole on the dielectric layer are formed. Optionally, the etching gas in the dry etching may be $CF_4$, or $SF_6$. The structure of the fabricated LTPS TFT is as shown in FIG. 1.

In this embodiment, the dielectric layer 6 is formed by performing a filming process such as the PECVD process and then is activated by performing a rapid thermal anneal (RTA). Optionally, the material of the dielectric layer 6 includes at least one of silicon nitride and silicon oxide. Further optionally, the dielectric layer 6 could be one layer of silicon oxide (SiOx) or silicon nitride (SiNx), or a stack of silicon oxide (SiOx) and silicon nitride (SiNx). Preferably, the material of the dielectric layer 6 is silicon oxide (SiOx).

In this embodiment, a PVD process is applied to deposit the source and the drain. Optionally, the materials of the source 7 and the drain 8 include one or several of, but not limited to, Al, Mo, Cu, Ag, Cr, Ti, AlNi and MoTi. Optionally, the materials of the source 7 and the drain 8 may be a stack composite of Mo/Al/Mo.

In the third aspect, an array substrate is provided by the embodiment of the present invention. The array substrate comprises the above LTPS TFT.

Figure 6:
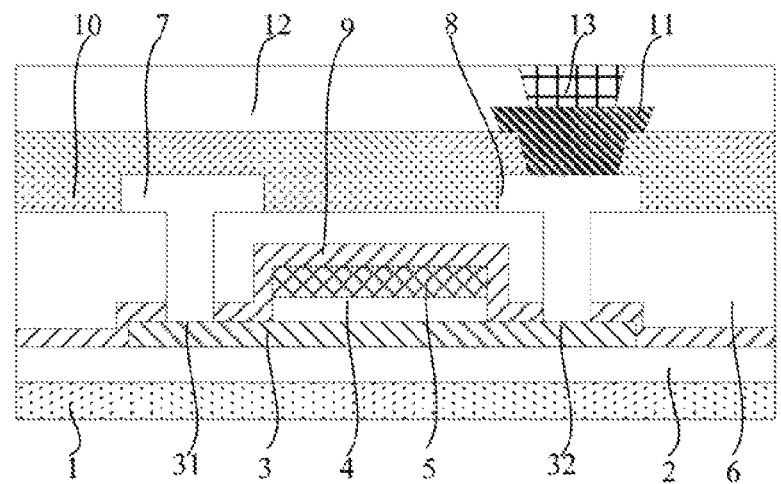
FIG. 6 is a scheme view illustrating the structure of the array substrate provided by an embodiment of the present invention.

Referring to FIG. 6, in this embodiment, the array substrate further comprises a planar layer (PLN) 10, a pixel electrode 11 and a pixel defining layer 12. The PLN 10 is formed with a through hole, and the pixel electrode 11 is connecting with the drain 8 of the LTPS TFT via the through hole. The pixel defining layer 12 is disposed on the PLN 10 and is formed with an opening for exposing a part of the pixel electrode 11. The opening is for disposing an organic light emitting device (OLED) 13 connecting with the pixel electrode 11.

In specific, after forming the LTPS TFT, the PLN 10 is deposited and patterned on the source 7 and the drain 8, and then is made with a through hole for exposing the drain 8. Then, the pixel electrode 11 is deposited and patterned on the through hole to connect electrically with the drain 8. The pixel defining layer 12 is formed on the PLN 10 and the pixel electrode 11 and is made with an opening for exposing a part of the pixel electrode 11. At last, the organic light-emitting material of the OLED is vapor deposited at the opening to connect with the pixel electrode 11 for achieving the OLED. Optionally, the material of the PLN 10 is an organic insulating material. Further optionally, the material of the PLN 10 is polyimide. The material of the pixel electrode 11 may be indium tin oxide (ITO), indium zinc oxide (IZO) or zinc oxide (AZO). Optionally, the material of the pixel defining layer 12 is polyimide.

In the method of fabricating the LTPS TFT provided by the embodiments of the present invention, an annealing is performed after depositing the insulation metal oxide layer on the source contact area to be formed and the drain contact area to be formed, for driving individually metal ions of the insulation metal oxide layer into the source contact area to be formed and the drain contact area to be formed, to form the source contact area and the drain contact area, and thereby to form the ohmic contact. Thus, the step of implanting p-type ions can be omitted, the procedure can be significantly simplified, and the manufacturing cost can be reduced.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A method of forming a low temperature polysilicon thin film transistor (LTPS TFT), comprising:
    providing a substrate;
    forming a buffer layer, a low temperature polysilicon layer, a source contact area to be formed, a drain contact area to be formed, a gate insulating layer and a gate layer on the substrate successively;
    wherein the source contact area to be formed and the drain contact area to be formed are disposed in a same layer with the low temperature polysilicon layer and at two opposite sides of the low temperature polysilicon layer separately;
    depositing an insulation metal oxide layer on the low temperature polysilicon layer to cover the source contact area to be formed and the drain contact area to be formed, and driving individually metal ions of the insulation metal oxide layer into the source contact area to be formed and the drain contact area to be formed to form the source contact area and the drain contact area after an annealing procedure; wherein the metal ions include at least one of Cu2+, Al3+, Mg2+, Zn2+ and Ni2+; and
    forming a source contacting the source contact area and a drain contacting the drain contact area on the low temperature polysilicon layer.

2. The method of forming the LTPS TFT according to claim 1, wherein a temperature of the annealing procedure is about 300-450° C. and a period of the annealing procedure is 30-50 min.

3. The method of forming the LTPS TFT according to claim 1, wherein a material of the insulation metal oxide layer includes at least one of CuO, Al2O3, MgO, ZnO and NiO.

4. The method of forming the LTPS TFT according to claim 1, wherein a thickness of the insulation metal oxide layer is about 10-20 nm.

5. The method of forming the LTPS TFT according to claim 1, further comprising:
    depositing a dielectric layer on the gate layer to cover the gate layer and the insulation metal oxide layer before forming the source and the drain;
    performing a dry etching to form a first contact hole and a second contact hole passing through the dielectric layer and the insulation metal oxide layer, for exposing the source contact area and the drain contact area separately; and
    forming the source connecting with the source contact area through the first contact hole and the drain connecting with the drain contact area through the second contact hole on the dielectric layer.

6. The method of forming the LTPS TFT according to claim 1, further comprising:
   removing the annealed insulation metal oxide layer by a dry etching before forming the source and the drain;
   depositing a dielectric layer on the gate layer to cover the gate layer, the low temperature polysilicon layer and the buffer layer;
   performing a dry etching to form a third contact hole and a fourth contact hole passing through the dielectric layer, for exposing the source contact area and the drain contact area separately; and
   forming the source connecting with the source contact area through the third contact hole and the drain connecting with the drain contact area through the fourth contact hole on the dielectric layer.

7. The method of forming the LTPS TFT according to claim 1, wherein a physical vapor deposition (PVD) process is applied to form the insulation metal oxide layer, and the PVD process includes applying an inert gas at a flow of 2-6 sccm, wherein a pressure of the inert gas is 0.2-1.0 Pa, and a deposition power of the PVD process is 10-15 kw.

\* \* \* \* \*